(12) United States Patent
Oonk

(10) Patent No.: US 6,202,186 B1
(45) Date of Patent: Mar. 13, 2001

(54) INTEGRATED CIRCUIT TESTER HAVING PATTERN GENERATOR CONTROLLED DATA BUS

(75) Inventor: John Mark Oonk, San Ramon, CA (US)

(73) Assignee: Credence Systems Corporation, Fremont, CA (US)

( * ) Notice: Subject to any disclaimer, the term of this patent is extended or adjusted under 35 U.S.C. 154(b) by 0 days.

(21) Appl. No.: 09/240,182

(22) Filed: Jan. 29, 1999

(51) Int. Cl.[7] .............................. G01R 31/28; G06F 11/00
(52) U.S. Cl. ................................................. 714/738
(58) Field of Search ..................... 714/724, 738, 714/739, 25, 30, 31, 40, 41, 734, 735, 742; 324/765

(56) References Cited

U.S. PATENT DOCUMENTS

| | | | |
|---|---|---|---|
| 4,701,918 | * 10/1987 | Nakajima et al. | 371/20 |
| 4,707,834 | * 11/1987 | Frisch et al. | 371/20 |
| 5,790,871 | * 8/1998 | Qureshi et al. | 395/733 |
| 5,951,705 | * 9/1999 | Arkin et al. | 714/738 |
| 6,028,439 | * 2/2000 | Arkin et al. | 324/765 |

FOREIGN PATENT DOCUMENTS 10-19995 * 1/1998 (JP) ........................ G01R/31/28

* cited by examiner

Primary Examiner—Albert De Cady
Assistant Examiner—Samuel Lin
(74) Attorney, Agent, or Firm—Daniel J. Bedell; Smith-Hill and Bedell

(57) ABSTRACT

An integrated circuit tester includes a host computer, a pattern generator and a set of tester circuits for performing a series of tests on an integrated circuit. The pattern generator is programmed to supply a sequence of pattern data as input to the tester circuits for controlling their operations during each test of the series. The pattern generator may also be programmed to interrupt the host computer before or during any test whenever it is necessary for the host computer to carry out an activity. The host computer may be programmed to respond to an interrupt by writing parameter control data into the tester circuits to reconfigure their operating characteristics, by acquiring test results from the tester circuits, or by directly controlling tester circuit operations during a test. When necessary to provide sufficient time for the host computer to carry out its task, the pattern generator may be programmed to temporarily suspend supplying pattern data to the tester circuits after sending an interrupt.

13 Claims, 4 Drawing Sheets

INTEGRATED CIRCUIT TESTER HAVING PATTERN GENERATOR CONTROLLED DATA BUS

BACKGROUND OF THE INVENTION

1. Field of the Invention

The present invention relates in general to an integrated circuit tester employing a pattern generator to control activities of a pin electronics circuit during a test, and in particular to a tester using the pattern generator to also provide on-the-fly adjustment of test parameters before or during the test.

2. Description of Related Art

A typical integrated circuit (IC) tester includes a set of tester channels, one for each pin of an integrated circuit device under test (DUT). During each cycle of a test, each channel can either supply a digital test signal to the pin or monitor a DUT output signal produced at the pin to determine whether the DUT is behaving as expected during the test cycle. At the start of each test cycle, a large central pattern generator provides input channel data concurrently to all channels defining an action or actions to be taken at the DUT terminal during the test cycle. The channel data typically includes "format set" (FSET) data indicating the action or actions to be taken during the test cycle and "time set" (TSET) data indicating a time or times during the test cycle at which the action is to be taken. When a channel is monitoring a DUT output signal during the test cycle a data value (PG) usually indicates the expected state or states of the DUT output signal. When the channel is to supply a test signal to the DUT terminal the PG data can be used with the FSET data to provide additional bits for selecting the format of the test signal.

A pattern generator typically includes an addressable pattern memory for storing at each address all of the channel control data needed for one cycle of the test. A counter or sequencer within the pattern generator sequentially addresses the pattern memory during the test so that it reads out the pattern data for each cycle of the test. The pattern memory is connected to a host computer via a conventional computer bus so that the host computer can write pattern data provided by a user into the pattern memory before the test.

The host computer also uses that bus to write control data into addressable storage locations within various tester components other than the pattern memory. This control data adjusts test parameters to meet the requirements of the test to be performed. For example, since DUTs operate at various logic levels, testers typically allow the host computer to adjust test signal logic levels. Since DUTs operate at various supply voltages levels, a tester allows the host computer to adjust the DUT power supply voltage. Also in some systems the host computer can adjust the manner in which each tester channel responds to various combinations of values of FSET, TSET and PG channel data during a test by writing control data to memories within the tester channels controlling how the channels decode the FSET, TSET and PG data into signals that actually control channel activities during the cycle.

Logic tests are often performed repeatedly on a DUT with operating parameters being changed before each repetition. For example if a DUT is rated as being operable with a supply voltage of 3 to 5 volts, DUT logic can be repeatedly tested at several different supply voltages between 3 and 5 volts to ensure that the DUT operates properly over its entire supply voltage range. Or if a DUT is supposed to respond to test signals having logic levels within a specified range, a logic test can be repeatedly performed at several logic levels within that range. Thus after each logic test a host computer must write new control data into the tester to adjust its operating parameters and then signal the pattern memory to repeat the logic test.

Some testers can also perform other tests in addition to digital logic tests. For example a tester may also perform a leakage current test to determine whether DUT leakage current is within an acceptable range or may be able to directly measure leakage current. In these testers a host computer can, for example after having the tester perform a digital logic test on a DUT, send control data configuring the tester to perform a leakage current test on the same DUT and then initiate a leakage current test.

Thus a prior art tester can perform a series of tests on a DUT. But to do so the host computer must wait for the pattern generator to signal that it has completed one test of a series, check the results of the test, write new control data to the tester to configure it for the next test, reprogram the pattern generator for the next test, and then signal the pattern generator to restart. This process is relatively slow. It would be desirable if a tester could carry out a series of tests requiring reconfiguration of the tester between or during tests, but without requiring the host computer to check test results or reprogram the pattern generator between tests.

SUMMARY OF THE INVENTION

An integrated circuit tester includes a host computer, a pattern generator and a set of tester circuits for performing a series of tests on an integrated circuit. The pattern generator is programmed to supply a sequence of pattern data as input to the tester circuits for controlling their operations during each test of the series. The pattern generator may also be programmed to interrupt the host computer before or during any test whenever it is necessary for the host computer to carry out an activity. The host computer may be programmed to respond to an interrupt by writing parameter control data into the tester circuits to reconfigure their operating characteristics, by acquiring test results from the tester circuits, or by directly controlling tester circuit operations during a test. When necessary to provide sufficient time for the host computer to carry out its task in response to the interrupt, the pattern generator may be programmed to temporarily suspend supplying pattern data to the tester circuits after sending the interrupt.

Thus when the tester is carrying out the series of tests, it is not necessary to stop, reprogram or restart the pattern generator whenever it is necessary for the host computer to reconfigure the operating characteristics of the tester circuits, to acquire test result, or directly control tester circuit operations. The invention reduces tester reconfiguration time between or during successive tests and therefore increases the speed and efficiency with which the tester carries out a series of tests.

It is accordingly an object of the invention to provide an integrated circuit tester for carrying out a series of tests without having to stop, reprogram or restart the pattern generator before each test.

It is another object of the invention to provide an integrated circuit tester for performing a test in which tester circuit parameters may be changed at any time during the test without having to stop, reprogram or restart the pattern generator.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWINGS(S)

DESCRIPTION OF THE PREFERRED EMBODIMENT(S)

Tester Architecture

Figure 1:
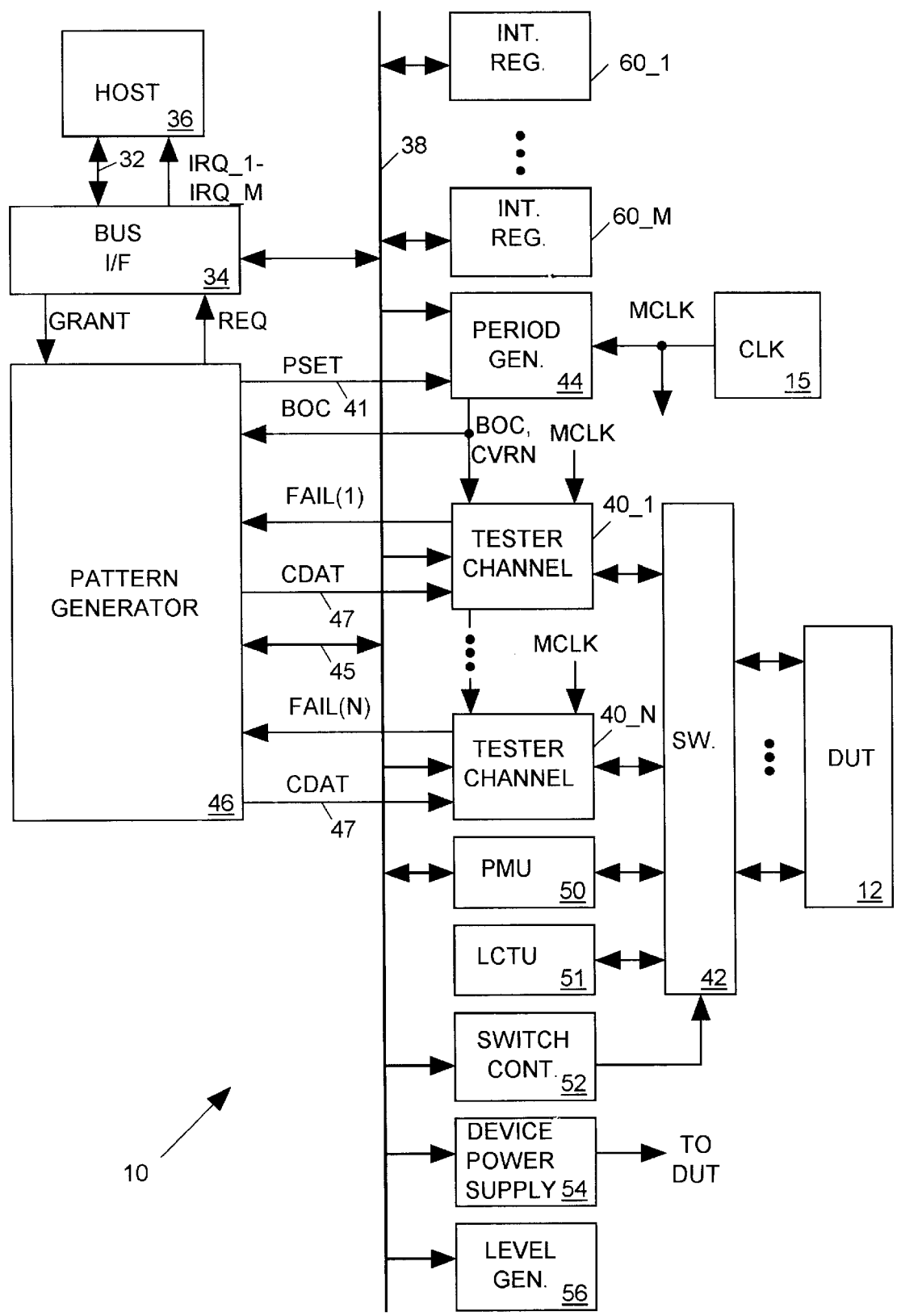
FIG. 1 illustrates an integrated circuit tester in accordance with the present invention.

FIG. 1 illustrates an integrated circuit tester 10 in accordance with the present invention for performing a series of tests on an integrated circuit device under test (DUT) 12 in response to data from an external host computer 36. Tester 10 includes a set of N tester channels 40_1–40_N each for carrying out test activities at a separate terminal of DUT 12 during digital logic tests. A switch circuit 42 selectively connects each channel 40_1–40_N to a corresponding DUT terminal. With a digital logic test organized into a set of successive test cycles, input channel data (CDAT) supplied to each tester channel 40_1–40_N via a set of data lines 47 at the start of each test cycle tells the channel how and when its output test signal is to change state during the test cycle, when to sample a DUT output signal during the test cycle, and what logic state the sampled DUT output is expected to have. Each channel 40_1–40_N pulses a corresponding output signal FAIL(1)–FAIL(N) when it detects that a DUT output signal fails to exhibit an expected state during any cycle of the test.

Tester channels 40_1–40_N are synchronous circuits clocked by a master clock signal MCLK a clock source 15. A period generator 44, also clocked by the MCLK signal, produces output signals BOC and CVRN indicating when each test cycle begins. The duration of each test period is determined by input data PSET supplied via data lines 41 to period generator 44 just before the start of each period. Period generator 44 supplies the BOC and CVRN signals to each tester channel 40_1–40_N. Before each cycle of a digital logic test, a pattern generator 46 supplies the CDAT data input to each channel 40_1–40_N and supplies the PSET input data to period generator 44. The BOC output signal from period generator 44 tells pattern generator 46 when to supply the PSET and CDAT values for a next test period. Pattern generator 46 also receives the FAIL(1)–FAIL (N) signals produced by tester channels 40_1–40_N.

Tester 10 also includes a conventional parametric measurement unit (PMU) 50 for measuring leakage current at a terminal of DUT 12, a leakage current test unit (LCTU) 51 used in performing a pass/fail leakage current test on DUT 12, a controller 52 for switch 42, a power supply 54 for providing power to DUT 12, and a reference level generator 56 for supplying reference voltages to tester channels 40_1–40_N and LCTU 51. Channels 40_1–40_N use the reference voltages as standards when setting the logic levels of the test signals they supply to DUT 12 and when measuring the logic levels of the DUT signals the channels monitor.

The external host computer 36 is connected to a conventional bus interface circuit 34 within tester 10 through a conventional bus 32 such as for example an Ethernet bus. Host computer 36 provides data for controlling activities of various components of tester 10. Bus interface 34 receives data and addressing information from host computer 36 via bus 32 and sends the data via a conventional parallel computer bus 38 to the appropriate addressable data storage locations within the various components of tester 10 connected to bus 38. Data written into pattern generator 46 via link 45 from bus 38 defines the output PSET and CDAT sequence it is to generate during a digital logic test. Control data written into period generator 44 tells period generator 44 how to decode its PSET data input from pattern generator 46. Control data written into tester channels 40_1–40_N tells them how to respond to various values of the CDAT input from pattern generator 46 during a test. Control data written into PMU 50, device power supply 54 and reference level generator 56 controls various test parameters including, for example, test voltage levels used during logic and leakage current tests and DUT power supply voltage, and also initiates tests. Finally control data supplied to switch controller 52 before each test determines which tester components access the terminals of DUT 12.

In accordance with the invention, during a test pattern generator 46 may send control data to any one of up to M registers 60_1–60_M via bus 38. M is an integer greater than 0. Whenever pattern generator 46 writes data to one of those M registers, bus interface 34 sends a corresponding interrupt signal IRQ_1–IRQ_M to host computer 36. Host computer 36 responds to each interrupt by executing a user-provided interrupt routine. An interrupt routine may, for example, tell host computer 36 to write control data into the various tester components via bus 38 so as to change their operating characteristics. Or an interrupt routine may tell host computer 36 to directly command various components connected to bus 38 to carry out a test without involvement of pattern generator 46. An interrupt routine may read the data that pattern generator 46 wrote to one of registers and use that data as parameter value.

After sending an interrupt to host computer 36, pattern generator 46 continues to operate. But it can be programmed to refrain from sending pattern data to tester channels 40_1–40_N for one or more cycles when necessary to allow host computer 36 time to respond to the interrupt. When a sufficient number of cycles have passed to allow host computer 36 to carry out its task, the pattern generator 46 can resume sending pattern data to the tester channels 40_1–40_N. Therefore the output pattern produced by pattern generator 46 not only controls tester activities during digital logic tests, it may also signal host computer 36 to adjust tester operating parameters between or during digital logic tests, signal the host computer to directly carry out other types of tests between digital logic tests, and pass data to the host computer. This feature gives tester 10 the ability to carry out a series of tests or reconfigure channels during a test without requiring the host computer 36 to repeatedly reprogram and restart pattern generator 46. The invention reduces tester reconfiguration time between or during successive tests and therefore increases the speed and efficiency with which tester 10 carries out a series of tests.

Pattern Generator

Figure 2:
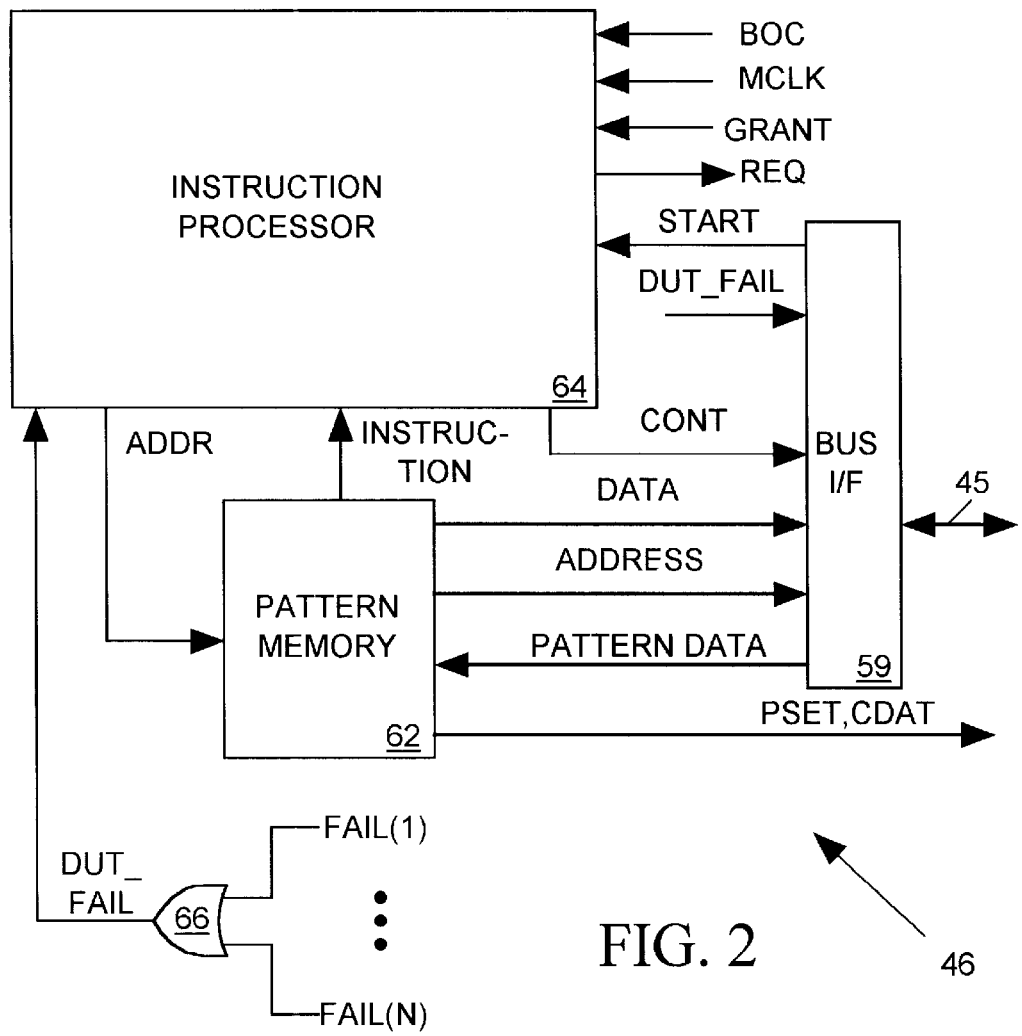
FIG. 2 illustrates the pattern generator of FIG. 1 in more detailed block diagram form.

FIG. 2 illustrates pattern generator 46 of FIG. 1 in more detailed block diagram form. To program pattern generator 46 host computer 36 of FIG. 1 supplies pattern data to pattern generator 46 by transmitting it to a bus interface 59 within pattern generator 46 via a link 45 to bus 38. Bus interface 59 writes the data into an addressable pattern memory 62. Pattern data stored at any given address of pattern memory 62 may include CDAT and PSET data to be provided to period generator 44 and tester channels 40_1–40_N for one cycle of a digital logic test. The stored pattern data may alternatively include an address (ADDRESS) and data (DATA) to be written via bus 38 to an addressable storage location within any of various tester components of FIG. 1 identified by the ADDRESS value before the start of a test. In addition to CDAT/PSET or ADDRESS/DATA pattern data, memory 62 also stores at each address an instruction (INSTRUCTION) to be supplied as input to an instruction processor 64. Instruction processor 64 negotiates with bus interface 34 of FIG. 1 for access to bus 38, controls addressing of pattern memory 62, and controls operations of bus interface 59.

To program tester 10 of FIG. 1 to perform a series of tests on DUT 12, host computer 36 writes an instruction and pattern data into each address of pattern memory 62 via bus interface circuit 59. When a DUT 12 is in place in the tester and ready to be tested, host computer 36 sends a start message via bus 38 causing bus interface circuit 59 to send a START signal to instruction processor 64. When instruction processor 64 receives the START signal it resets sets the address (ADDR) input to pattern memory 62 to 0 to address the first storage location in pattern memory 62. That storage location contains an instruction telling instruction processor 64 that the current output of pattern memory 62 contains data to be written to the indicated address on bus 38. Instruction processor 64 executes that instruction by transmitting a bus request signal pulse (REQ) to bus interface 34 of FIG. 1. When bus 38 is available for use, bus interface circuit 34 transmits a sequence of GRANT signals to instruction processor 64. The GRANT signals cause instruction processor 64 to send a sequence of control signals to bus interface 59 telling it to send the DATA and ADDRESS output of pattern memory 62 in the proper sequence onto bus 38 of FIG. 1 via link 45. As bus interface 59 places the ADDRESS and DATA values data on bus 38, bus interface circuit 34 of FIG. 1 produces the control signals on bus 38 needed to write the DATA value into the storage location referenced by the ADDRESS value.

Normally the ADDRESS value stored at the first pattern memory location references one of the interrupt registers 60_1–60_M. Therefore bus interface circuit 34 stores the DATA value read out of pattern memory 62 in that interrupt register and then sends one of interrupt signals IRQ1–IRQ_M to host computer 36. Host computer 36 may be programmed to respond to the interrupt by writing parameter control data into various addressable control registers or memory locations within the various devices (40, 41, 50–56) connected to bus 38 to set their operating characteristics for the first test of the sequence. If necessary, the INSTRUCTION input to instruction processor 64 from that first pattern memory address may tell instruction processor 64 to wait an indicated number of clock cycles to allow the host computer time to execute its interrupt routine and to then increment the address of pattern memory 62 so that it reads out the pattern data and instruction stored at the next address.

If the first test of a series of tests to be performed by tester 10 is a digital logic test, the next addressed storage location of pattern memory 62 contains the PSET and CDAT data for the first cycle of the test. That data is delivered to period generator 44 and tester channels 40_1–40_N. The INSTRUCTION data output of pattern memory 62 tells instruction processor 64 to then wait until it receives a BOC signal pulse from period generator 44 of FIG. 1 indicating that pattern data for the next cycle is needed. Instruction processor 64 then increments the pattern memory address so that it reads out the PSET and CDAT data for the next cycle of the test.

The process continues until the first test is complete or until a point is reached at which host computer 36 must carry out some activity. At that point the next address within pattern memory 62 again contains data to be written to one of the interrupt registers 60_1–60_M. On storing the data in that interrupt register, bus interface circuit 34 again sends one of interrupt signals IRQ_1–IRQ_M to host computer 36 causing it to execute an interrupt program. The data written to the interrupt register 60_1–60_M may, for example, identify the second test to be performed on DUT 12. The interrupt program then reads the data out of that interrupt register and writes the appropriate control data into various addressable register and memory locations of devices so as to configure tester 10 to carry out the indicated test.

After interrupting the host, the next INSTRUCTION input to instruction processor 64 may tell it, if necessary, to wait for a sufficient number of clock cycles to allow host computer 36 enough time to respond to the interrupt. Instruction processor 64 then resumes incrementing the address of pattern generator 46 for each cycle of the second test. This process is repeated whenever it is necessary for the host computer 36 to carry out an action such as reconfiguring the tester channel 40 before or during a test, acquiring test results, or directly controlling tester activities.

Host computer 36 may directly control operations of various devices connected to bus 38 during some analog tests. In such case, the INSTRUCTION input to instruction processor 64 at the end of a preceding test tells the instruction processor write data into an interrupt register 60_1–60_M to interrupt host computer 36 and tell it to execute a subroutine causing it to carry out the test. The next INSTRUCTION input may also tell instruction processor 64 to wait for a sufficient number of clock cycles to allow host computer 36 to carry out the test.

At the end of the last test of the sequence the INSTRUCTION output of pattern memory 62 tells the instruction processor 64 to write one more data value to an interrupt register 60_1–60_M to again interrupt host computer 36. That interrupt tells host computer 36 that the test sequence is at an end. Instruction processor 64 then waits until it receives another START signal before resetting the address of pattern memory 62 to 0 to restart the test sequence.

If at any time one of channels 40_1–40_N produces a FAIL(1)–FAIL(N) signal, indicating that DUT 12 of FIG. 1 has failed to perform as expected, an OR gate 66 produces an output DUT_FAIL signal as an interrupt input to instruction processor 64 and as an input signal to bus interface 59. The DUT_FAIL signal tells instruction processor 64 to stop addressing pattern memory 62 and to wait until it receives a START signal, and to then begin another test sequence by addressing the first storage location of pattern memory 62. The DUT_FAIL signal input to bus interface 59 tells it to write data to one of the interrupt registers 60_1–60_M causing bus interface 34 to send one of interrupt signals IRQ1–IRQ_M to host computer 36 to tell the host computer that the DUT has failed the test.

When an interrupt signal tells host computer 36 that a test sequence has reached an end or has resulted in a failure, host computer 36 waits until DUT 12 is replaced with another DUT to be tested, and then sends a START message to pattern generator 46 via bus interface 34 and bus 38 to tell the pattern generator to restart the test sequence.

Period Generator

Figure 3:
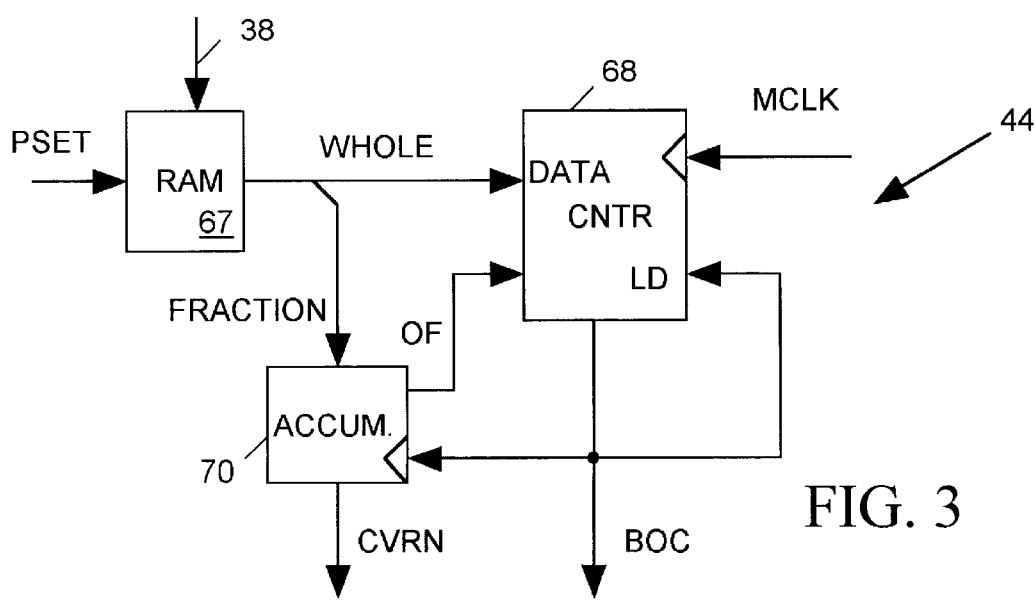
FIG. 3 illustrates the period generator of FIG. 1 in more detailed block diagram form.

FIG. 3 illustrates period generator 44 of FIG. 2 in more detailed block diagram form. Period generator 44 responds to the PSET output of pattern generator 46 by producing an output BOC signal and an output CVRN data value. The BOC signal indicates a last MCLK pulse preceding a start of a next test cycle while the CVRN data indicates a fractional portion of one MCLK cycle after that MCLK pulse that the next test cycle actually begins.

A main test cycle spans a whole and fractional number of master clock MCLK cycles. The PSET output of pattern generator 46 of FIG. 1 addresses a RAM 67 loaded with data from pattern generator 46 as it executes the setup instructions. RAM 67 acts as a lookup table to convert each of the 16 possible PSET values to data defining a test cycle length. The data output of RAM 67 of FIG. 3 includes WHOLE and FRACTION values respectively indicating the whole and fractional portions of the period of the next main test cycle. On the trailing edge of next BOC signal pulse, the WHOLE data is loaded into a counter 68 and the FRACTION value is accumulated by an accumulator 70. Counter 68 then begins counting MCLK signal pulses. When its count reaches WHOLE, counter 68 generates a next BOC pulse. The leading edge of the BOC pulse tells pattern generator 46 of FIG. 2 to produce a new PSET value, thereby causing RAM 67 to produce a WHOLE/FRACTION data pair for the next test cycle. Accumulator 70 accumulates successive FRACTION data values to produce the CVRN data. Accumulator 70 overflows when the accumulated CVRN data indicates a period greater than one MCLK cycle and provides an overflow signal OF to a +1 input of counter 68. When counter 68 next loads a WHOLE value it sets its count limit to WHOLE+1. Thus the BOC output of counter 68 indicates a last MCLK pulse preceding a start of a next test cycle while the CVRN data indicates a fractional portion of one MCLK cycle after that MCLK pulse that the next test cycle actually begins.

Tester Channel

Figure 4:
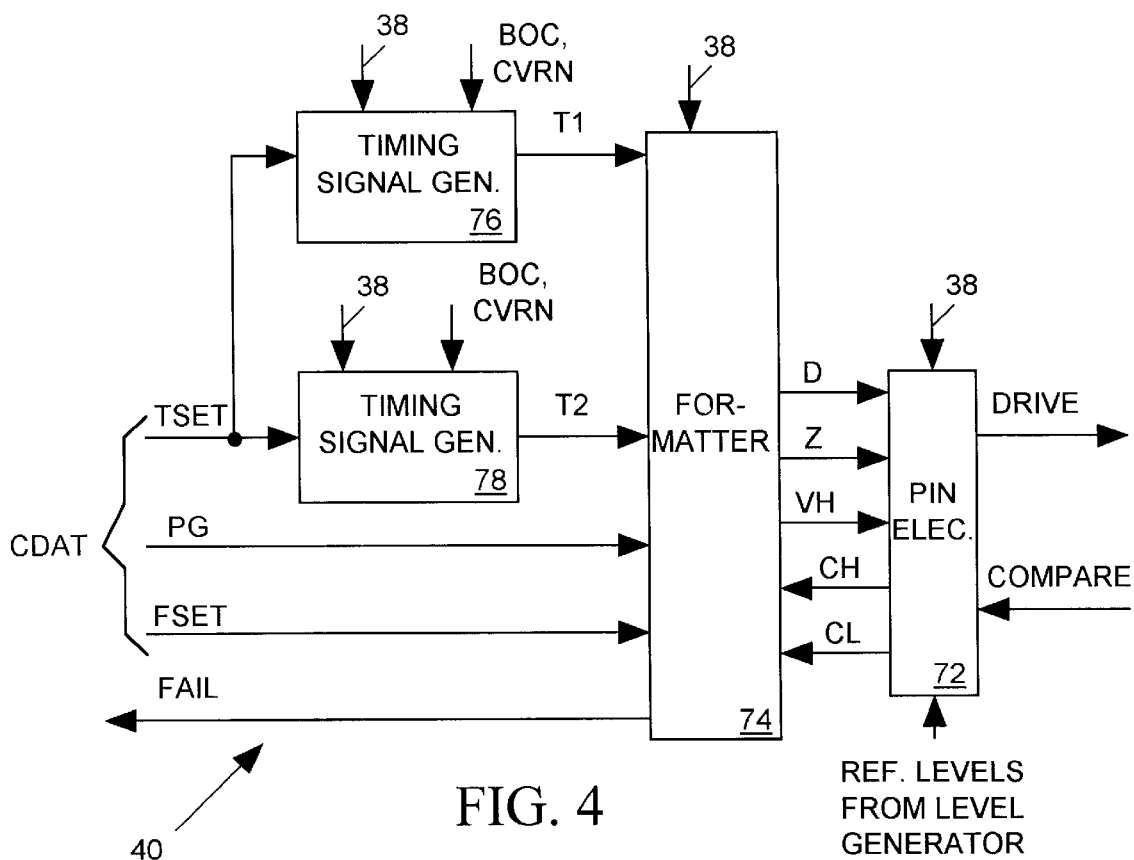
FIG. 4 illustrates a typical tester channel of FIG. 1 in more detailed block diagram form.

FIG. 4 illustrates tester 40_1 of FIG. 1 in more detailed block diagram form. Testers 40(2)–40_N are similar. The channel data CDAT pattern generator 46 of FIG. 2 supplies to each channel 40_1–40_N for each test cycle includes format set data (FSET), time set data (TSET), and reference data (PG). The FSET data references a particular drive or compare format the channel is to use during the cycle. A drive format includes the manner in which the channel data determines successive test signal states during the test cycle and the manner in which the channel times test signal state changes. A compare format includes the manner in which the channel determines the expected states of the output signal and the manner in which the channel compares the output signal to its expected states and produces the FAIL(1)–FAIL(N) signal. The TSET data indicates certain times during a test cycle at which an event is to occur. A test may include, for example, a test signal state change or a DUT output signal comparison.

Tester channel 40_1 includes a pin electronics circuit 72 for supplying the test signal to the DUT terminal in response to a set of drive control signals (D, Z and VH). The D control signal tells the pin electronics circuit 72 whether to drive its output test signal (DRIVE) to a high or low logic level. The VH signal tells pin electronic circuit 72 whether to drive the DRIVE signal to a secondary voltage. The Z control signal tells pin electronics circuit 72 when to tristate the DRIVE signal. During each test cycle pin electronics circuit 72 also monitors the DUT output signal COMPARE the DUT terminal and produces compare high and compare low signals (CH and CL) indicating whether the DUT output signal is currently above a high logic level or below a low logic level. Pin electronics circuit 72 uses signals from level generator 56 of FIG. 1 as references when determining the DUT's high and low logic levels.

In addition to pin electronics circuit 72, tester channel 40_1 includes a formatter circuit 74 and two timing signal generators 76 and 78. Each timing signal generator 76 or 78 receives TSET data from pattern generator 46 and the BOC and CVRN signals from period generator 44 at the start of each test cycle and pulses an output timing signal T1 or T2 once during each test cycle with a delay following the start of the test cycle indicated by the TSET data. The BOC and CVRN signals indicate when each test cycle begins.

Formatter circuit 74 receives the FSET data from pattern generator 46 and supplies the drive control signals D, Z and VH to pin electronics circuit 72 causing it to carry out a drive format indicated by the FSET data. When the FSET data references a drive format the PG data may indicate states to which the formatter is to set the drive control signals and the timing signals T1 and T2 indicate tell formatter circuit 74 when to adjust states of drive control signals D, Z and VH. When the FSET data references a compare format, formatter circuit 74 samples the compare high CH and CL outputs of the pin electronics circuit at times indicated by the T1 and/or T2 timing signals and determines therefrom whether to assert its output FAIL(1) signal during the test cycle. In some compare formats the PG data references expected states of the CH and CL data.

Either host computer 36 or pattern generator 46 of FIG. 1 may write control data into timing signal generators 76 and 78 and formatter 74 via bus 38. The control data supplied to timing generators 76 and 78 relates a particular T1 and T2 timing signal pulse delay to each possible value of TSET. The programming data supplied to the formatter 74 of each channel relates a particular drive and control format to each possible combination of FSET and PG data.

Formatter

Figure 5:
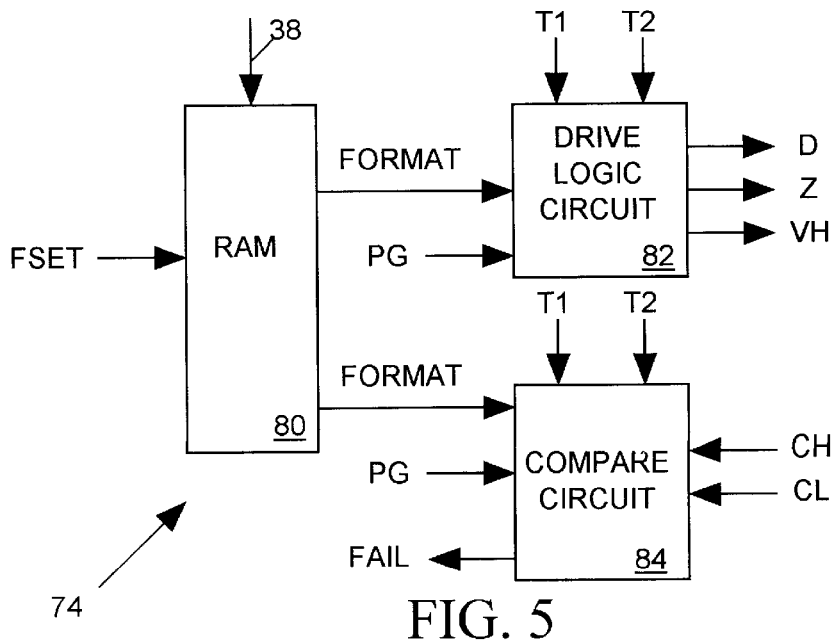
FIG. 5 illustrates the formatter of FIG. 4 in more detailed block diagram form.

FIG. 5 illustrates formatter 74 of FIG. 4 in more detailed block diagram form. Referring to FIG. 5, formatter 74 receives a 4-bit FSET data value from pattern generator 46 of FIG. 2 for each main test cycle. The FSET data indicates a particular test format to be carried out by a tester channel at the DUT terminal during the test cycle. The 4-bit FSET data value addresses a RAM 80, having 16 storage locations, one for each value of the FSET data. Before the test begins, pattern generator 46 of FIG. 1 writes format control data (FORMAT) in each storage location of RAM 80 via bus 38. Although each channel is capable of executing a large number of different types of test formats, the PSET data value supplied to the formatter 74 has only four bits and can only take on 16 different values. Thus the FSET data value can only represent 16 of the large number of different test formats formatter 74 can produce. The data stored in the 16 storage locations of RAM 80 determines which 16 of the many possible test activities channel 40 will be able to perform during the test. Since pattern generator 46 of FIG. 1 may write different control data into the RAM 80 of the formatter 74 of each tester channel 40_1–40_N of FIG. 1, the tester channels do not all have to be programmed for the same 16 formats.

During a test, when an incoming FSET data value addresses RAM 80, RAM 80 reads out a portion of the addressed FORMAT data to a drive logic circuit 82 and reads out another portion of the addressed FORMAT data to a compare logic circuit 84. The drive logic circuit 82 also receives the T1 and T2 timing signals from the timing generators 76 and 78 of FIG. 4 and the reference data bits PG of the channel data CDAT from pattern generator 46 of FIG. 1. Drive logic circuit 82 supplies the output D, Z and VH signals to pin electronics circuit 72 of FIG. 4 with the particular sequence of state changes in the D, Z and VH signals being controlled by the FORMAT data and with the timing of those state changes being controlled by the T1 and T2 timing signals. In some drive formats bits of the PG data indicate states to which the D, Z and/or VH signals are to be driven. In other drive formats, the new states of the D, Z and/or VH signals are specified by the format itself and are independent of the PG data.

The compare logic circuit 84 also receives the T1 and T2 timing signals and PG data as well as the compare high (CH) and compare low (CL) output signals of pin electronics circuit 72 of FIG. 4. The compare logic circuit 84 compares the CH and/or CL signals to their expected states and asserts the FAIL signal when the CH and CL signal states are not as expected during a test cycle. The FORMAT data controls the manner (format) in which compare logic circuit 84 carries out the comparison. The FORMAT data input to compare logic circuit 84 selects the T1 and/or T2 timing signal that will control the timing of the comparison. In some compare formats the two-bit reference data PG indicates expected CH and CL signal states. In other compare formats, the expected states are specified by the format itself and are independent of the PG data.

Leakage Current Measurement and Pass/Fail Tests

Figure 6:
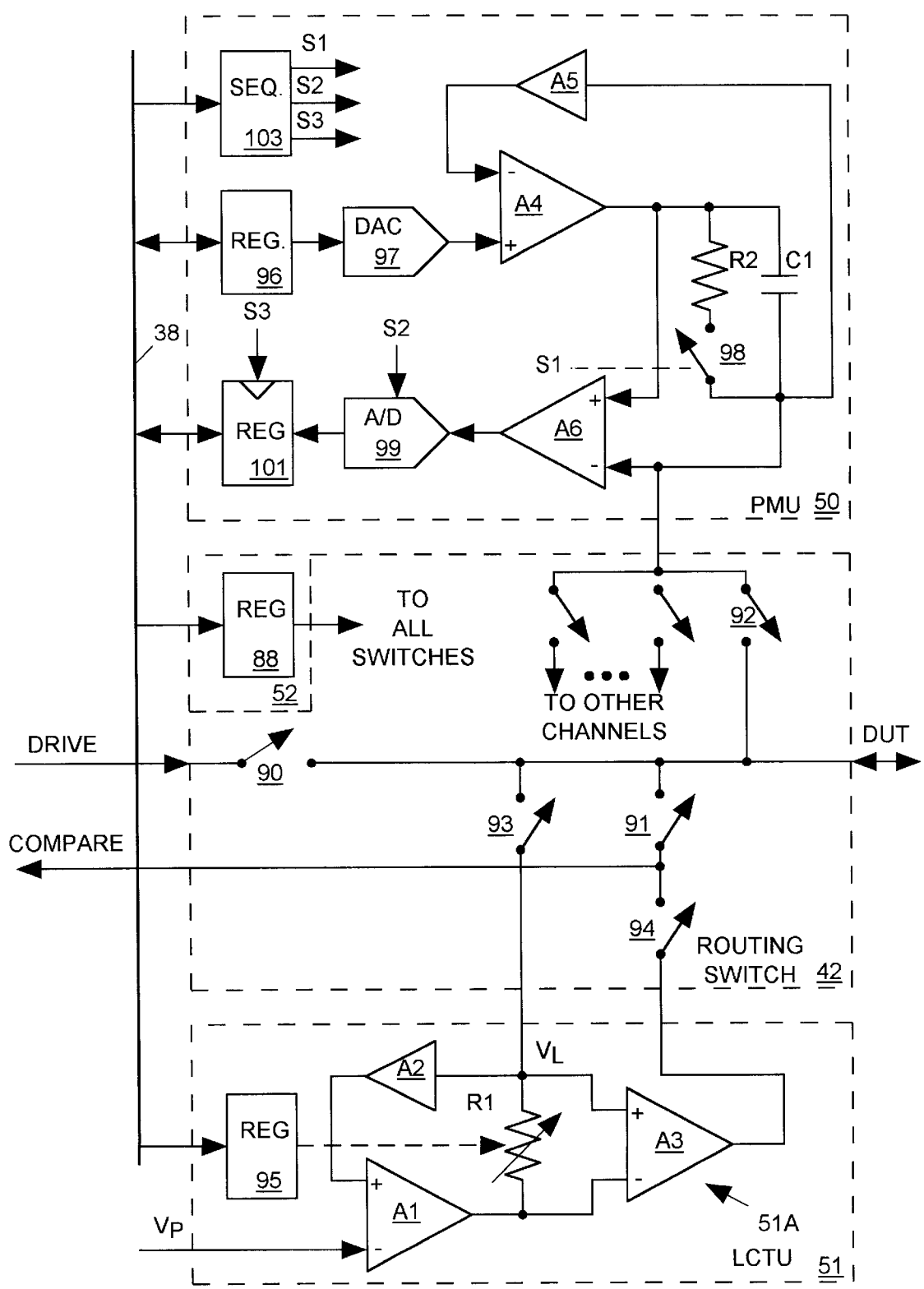
FIG. 6 illustrates the parametric measurement unit (PMU), the leakage current test unit (LCTU) and the routing switch of FIG. 1 in more detailed block diagram form.

FIG. 6 illustrates PMU 50, LCTU 51, switch controller 52 and switch 42 of FIG. 1 in more detailed block diagram form. Switch 42 selectively interconnects tester channels 40_1–40_N, PMU 50 and LCTU 51 to the various DUT terminals. Switch positions are controlled by bits of control data pattern generator 46 of FIG. 1 writes into a register 88 of switch controller 52. During a digital logic test, a switch 90 is closed to connect the DRIVE signal output of the pin electronics circuit 72 (FIG. 4) of one of tester channels 40_1–40_N of FIG. 2 to the DUT terminal. A switch 91 is closed to provide the DUT output signal as the COMPARE signal input to pin electronics circuit 72 of FIG. 4. Switches 92, 93, and 94 are open to isolate PMU 50 and LCTU 51 from the DUT terminal.

LCTU 51 includes 48 voltage source circuits 51A, each for providing a test voltage to a separate DUT terminal via switch 42 during a leakage current pass/fail test. Only one such voltage source circuit 51A is shown in FIG. 6. During the leakage current pass/fail test switches 90, 91 and 92 are open. Switch 93 is closed to permit an amplifier A1 within LCTU 51 to apply a test voltage $V_L$ to the DUT terminal through a variable resistor R1. Current into or out of the DUT terminal produces a voltage across resistor R1. An amplifier A3 in LCTU 51 amplifies the voltage developed across resistor R1 and supplies it via closed switch 94 as the COMPARE signal input to pin electronic circuit 72 (FIG. 4) of one of channels 40_1–40_N. The channel 40_1–40_N asserts its output FAIL(1)–FAIL(N) signal if the voltage of the COMPARE signal is above predetermined threshold value, indicating that the current at the DUT terminal is outside a specified range. A reference voltage $V_P$ from level generator 51 of FIG. 2 indicating the desired level of $V_L$ is supplied to one input of differential amplifier A1. A unity gain amplifier A2 feeds $V_L$ back to the other input of amplifier A1. The feedback provided by amplifier A2 causes amplifier A1 to maintain $V_L$ at the desired test voltage $V_P$ regardless of the amount of leakage current through the DUT terminal. A register 95 stores set up data from pattern generator 46 of FIG. 1 for controlling the value of R1 during the test.

During a parametric leakage current measurement test, PMU 50 is connected through switch 92 to one of the DUT terminals to measure its leakage current. Switches 90, 91, 93 and 94 are held open. In the parametric test, a specified voltage at which the leakage current is to be measured is forced onto a DUT terminal and the resulting leakage current flow into or out of the DUT terminal is measured. Parametric tester 50 includes an addressable register 96 for storing control data provided by host computer 36 of FIG. 1 via bus 38 during system set up. The data value stored in register 96 drives a digital-to-analog converter (DAC) 97 providing a reference voltage to a differential amplifier A4. Amplifier A4 produces a voltage at the DUT terminal through a resistor R2 and switch 98 in parallel with a capacitor C1. With the voltage at the DUT terminal fed back to an input of amplifier A4 via a unity gain amplifier A5, amplifier A4 maintains the DUT terminal voltage at the level indicated by the output of DAC 97. An amplifier A6 amplifies the voltage developed across R2 to provide an input to a analog-to-digital (A/D) converter 99. A/D converter 99 digitizes the output of amplifier A6 and supplies it to a register 101 read accessed after the test sequence is complete by host computer 36 of FIG. 1 via bus 38. During the test, a sequencer 103 produces output control signals 51–53 for controlling switch 98, A/D converter 99 and register 101.

After storing data in register 88 of switch controller 52 to connect PMU 50 to a desired DUT terminal via switch 92, pattern generator 46 writes a data bit to sequencer 103 via bus 38 telling it to assert the S1 signal to close switch 98. Switch 98 discharges capacitor C1 and allows amplifier A4 to drive the DUT terminal to the test voltage. Sequencer 103 then deasserts S1 to open switch 98, allowing leakage current at the DUT terminal to charge capacitor C1. Amplifier A6 amplifies the voltage across C1. After a predetermined time, sequencer 103 briefly asserts an output signal S2 causing a A/D converter 99 to sample and convert the output of amplifier A6 to a digital quantity supplied to the input of a register 101. An output signal S3 of sequencer 103 tells register 101 to store the data output of A/D converter 99. After the test sequence is complete, host computer 36 of FIG. 1 may read the data in register 101 via bus 38 and compute the leakage current. Leakage current is proportional to the sampled output voltage of amplifier A6 divided by the time C1 was allowed to charge, the interval between the time sequencer 103 turns off S1 and the time it pulses S2.

Thus has been shown and described an integrated circuit tester 10 having a pattern generator 46 that can be programmed to carry out a series of tests on a DUT and to automatically signal host computer 36 to carry out activities such as reconfiguring tester circuits before or during each test.

While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. An apparatus for performing a series of tests on an integrated circuit (12), the tester comprising:

a host computer (36);

a pattern generator (46);

a plurality of tester circuits (40, 44, 50–56); and bus means (32, 34, 38, 41, 47, 60) for interconnecting said host computer, said pattern generator and said plurality of tester circuits, wherein said tester circuits perform said series of tests on said integrated circuit, with characteristics of each test of said series of tests being determined by parameter control data written into said tester circuits, and with actions to be carried out by said tester circuits during each test of said series of tests being controlled by a sequence of pattern data supplied as input to said tester circuits during the test, wherein the pattern generator is programmed to supply a sequence of pattern data to said tester circuits via said bus means during each test of said series of tests and to interrupt said host computer via said bus means when said host computer is to supply a sequence of pattern data to said tester circuits via said bus means during each test of said series of tests, wherein the pattern generator includes means for transmitting an interrupt to said host computer via said bus means at any time during said series of tests, and wherein the host computer responds to said interrupt by writing parameter control data into said tester circuits via said bus means to configure them for carrying out the test.

2. The apparatus in accordance with claim 1 wherein said bus means comprises:

an addressable interrupt register (60), a bus (38) connected to said pattern generator, said tester circuits and said addressable register, and interface means (34) linking said host computer to said bus, wherein said host computer writes parameter control data to said tester channels via said bus and said interface means, and wherein said pattern generator tells said interface means to interrupt said host computer by writing interrupt data to said addressable interrupt register via said bus.

3. The apparatus in accordance with claim 2 wherein upon being interrupted, said host computer reads said interrupt data out of said interrupt register.

4. The apparatus in accordance with claim 2 wherein said pattern generator is also programmed to write parameter control data to said tester circuits via said bus means.

5. The apparatus in accordance with claim 1 wherein said tester circuits comprise a plurality of tester channels (40), each for carrying out test activities at a separate terminal of said integrated circuit.

6. The apparatus in accordance with claim 1 wherein said test activities carried out by said tester circuits during one test of said series of tests comprise transmitting a test signal to said integrated circuit and wherein parameter control data written to said tester circuits controls logic levels of said test signal.

7. The apparatus in accordance with claim 1 wherein said test activities carried out by said tester circuits during one test of said series of tests comprise supplying a power signal to said integrated circuit and wherein parameter control data written to said tester circuits controls a voltage of said power signal.

8. An apparatus for successively performing a digital logic test and a parametric test at terminals of an integrated circuit device under test (DUT), the apparatus comprising:

digital logic testing means (40) for carrying out the digital logic test in response to a pattern data sequence identifying test activities to be performed at said terminals during the digital logic test, wherein a parameter of said test activities is controlled in accordance with first control data delivered into a first addressable storage location included within said digital logic testing means;

parametric testing means (50) for performing the parametric test by generating and supplying to one of the DUT terminals a parametric test signal having a first parameter controlled by second control data stored in a second addressable storage location included in said parameter testing means and for thereupon measuring a second parameter of said signal;

switch means (42, 52) for selectively connecting said digital logic testing means and said parametric testing means to DUT terminals in response to third control data stored in a third addressable storage location included in said switch means;

a host computer (36) for reading first interrupt data and generating said first control data in response to a first interrupt signal, for reading second interrupt data and for generating said second and third control data in response to a second interrupt signal;

a pattern generator (46) for programmed for first generating said first interrupt data, then generating said pattern data sequence, then generating said second interrupt data;

bus means (32, 34, 38, 45, 60) interconnecting said host computer, said pattern generator, said digital logic testing means, said parametric testing means and said switch means, for generating said first interrupt signal and conveying said first interrupt data to said host computer when said pattern generator generates said first interrupt data, for generating said second interrupt signal and conveying said second interrupt data to said host computer when said pattern generator generates said second interrupt data, for conveying said first, second and third control data to said first, second and third addressable storage locations, respectively, when generated by said host computer; and means (47) for delivering said pattern data sequence from said pattern generator to said digital logic testing means during said digital logic test.

9. The apparatus in accordance with claim 8 wherein said digital logic testing means comprises a plurality of tester channels (40_1–40_N), each for carrying out test activities at a separate terminal of said DUT in response to separate portions of said pattern data sequence.

10. The apparatus in accordance with claim 8 wherein said test activities carried out by said testing means comprise transmitting a test signal to a terminal of said DUT and wherein said test parameter comprises a voltage of said test signal.

11. An integrated circuit tester comprising:

bus means (32, 33, 38, 45, 60);

a host computer (36) connected to said bus means;

a pattern generator (46) connected to said bus means;

a plurality of data lines (47); and a plurality of tester circuits connected to said bus means and linked to said pattern generator via said set of data lines, wherein the tester circuits perform test activities on an integrated circuit in response to sequences of test control data arriving via said set of data lines wherein the host computer responds to an interrupt signal via said bus means by writing parameter control data into the tester circuits via said bus means telling the tester circuits how to adjust various parameters of test activities to be performed in response to a pattern data sequence arriving on said data lines, wherein the host writes pattern control data into the pattern generator via said bus means, wherein the pattern control data tells the pattern generator to signal said bus means to send said interrupt signal to said host computer and to thereafter generate and transmit said pattern data sequence to said tester circuits via said data lines.

12. An integrated circuit tester comprising:

a plurality of tester circuits (40) for performing a test on an integrated circuit in response to an input pattern data sequence;

a host computer (36) for responding to interrupt data transmitted thereto by providing parameter control data to said tester circuits for controlling operating characteristics thereof; and a pattern generator (46) for supplying said sequence of pattern data to said tester circuits during said test and for transmitting said interrupt data to the host computer during said test.

13. The integrated circuit tester in accordance with claim 12 wherein the pattern generator temporarily halts its supplying of pattern data to the tester circuits after transmitting said interrupt data to said host computer until said host computer has had sufficient time to provide said parameter control data to said tester circuits, and then automatically resumes supplying said pattern data to said tester circuits.

* * * * *